United States Patent [19]

Takagi

[11] Patent Number: 5,781,578
[45] Date of Patent: Jul. 14, 1998

[54] OPTICAL SEMICONDUCTOR DEVICE

[75] Inventor: Kazuhisa Takagi, Tokyo, Japan

[73] Assignee: Mitsubishi Denki Kabushiki Kaisha, Tokyo, Japan

[21] Appl. No.: 735,080

[22] Filed: Oct. 18, 1996

[30] Foreign Application Priority Data

Jul. 29, 1996 [JP] Japan .................................. 8-198783

[51] Int. Cl.$^6$ ...................................... H01S 3/096
[52] U.S. Cl. .................... 372/50; 372/38; 372/26; 359/181; 359/237
[58] Field of Search ................... 372/50, 38, 26; 359/180, 181, 237; 327/437

[56] References Cited

U.S. PATENT DOCUMENTS

| | | | |
|---|---|---|---|
| 4,274,014 | 6/1981 | Schade, Jr. | 327/437 |
| 5,546,218 | 8/1996 | Komatsubara et al. | 359/237 |
| 5,602,672 | 2/1997 | Ishimura et al. | 359/245 |
| 5,631,916 | 5/1997 | Georges et al. | 372/26 |
| 5,663,823 | 9/1997 | Suzuki | 359/181 |

FOREIGN PATENT DOCUMENTS 373915  3/1991  Japan .
774420  3/1995  Japan .

*Primary Examiner*—Rodney B. Bovernick
*Assistant Examiner*—Yisun Song
*Attorney, Agent, or Firm*—Leydig, Voit & Mayer, Ltd.

[57] ABSTRACT

An optical semiconductor device includes a semiconductor laser diode having a first electrode for receiving a current for driving the laser diode, and a grounding electrode; a modulator for modulating light emitted from the semiconductor laser diode, the modulator having a second electrode for receiving a current for driving the modulator, and a grounding electrode connected to the grounding electrode of the semiconductor laser diode; a first resistor having a terminal connected to the first electrode of the laser diode; a second resistor connected between the second electrode of the modulator and the grounding electrode of the modulator; and a third resistor having a first terminal connected to the grounding electrode of the modulator and a grounded second terminal. Therefore, the laser diode driving current can be made larger when the modulator absorbs the laser light than when the modulator does not absorb the laser light, so that the oscillating wavelength is shortened, resulting in an inexpensive optical semiconductor device that hardly degrades optical pulse transmission performance.

4 Claims, 5 Drawing Sheets

OPTICAL SEMICONDUCTOR DEVICE

FIELD OF THE INVENTION

The present invention relates to an optical semiconductor device employed for optical fiber communication.

BACKGROUND OF THE INVENTION

In optical fiber communication, as a light source for broad-band transmission exceeding 2.5 Gb/s, an integrated electroabsorption modulator and semiconductor laser diode is employed.

FIG. 10 is a perspective view, partly broken away, illustrating a conventional integrated modulator and laser diode (hereinafter referred to as LD). In FIG. 10, an integrated modulator and LD 14 comprises a modulator 100 and a distributed feedback (DFB) LD 200. Reference numeral 1 designates an n type InP substrate. An n type InP cladding layer 2 is disposed on the substrate 1. An InGaAsP active layer 3 is disposed on the cladding layer 2. A first p type InP cladding layer 4 is disposed on the active layer 3. The n type InP cladding layer 2, the active layer 3, and the first p type InP cladding layer 4 form a ridge in the center of the structure. Intrinsic (hereinafter referred to as i type) InP current blocking layers 5 are disposed on the substrate 1, contacting both sides of the ridge. A second p type InP cladding layer 6 is disposed on the ridge and on the current blocking layers 5. A p type InGaAsP contact layer 7 is disposed on the second p type InP cladding layer 6. An insulating film 10, such as $SiO_2$, is disposed on the contact layer 7. A surface electrode 8 for the modulator 100 (hereinafter referred to as a modulator surface electrode, and a surface electrode 9 for the LD 200 (hereinafter referred to as an LD surface electrode) are disposed on the insulating film 10. A grounding rear electrode 11 common to the modulator 100 and the LD 200 is disposed on the rear surface of the substrate 1. Reference numeral 40 designates a diffraction grating. The modulator 100 and the LD 200 are separated from each other by a separation groove 41 that reaches the second p type InP cladding layer 6. The modulator surface electrode 8 and the LD surface electrode 9 are electrically insulated from each other by the separation groove 41. The insulation resistance r is several k$\Omega$.

FIG. 8 is a perspective view illustrating a conventional optical semiconductor device 303 in which an integrated modulator and LD 14 as shown in FIG. 10 is mounted on a submount comprising a dielectric, such as $Al_2O_3$. FIG. 8, the same reference numerals as those shown in FIG. 10 designate the same or corresponding parts. The optical semiconductor device 303 includes an $Al_2O_3$ substrate 16 having opposed front and rear surfaces. The rear surface of the substrate 16 is metallized for grounding (not shown). A strip line 20 for grounding is disposed on the front surface of the substrate 16 and connected to the metallized rear surface of the substrate 16 via a through-hole 15. An LD feeding strip line 17 and a modulator feeding strip line 18 are disposed on the front surface of the substrate 16. A resistor 19 is disposed on a portion of the grounding strip line 20. An electrode 21 for mounting is disposed on the front surface of the substrate 16, and an integrated modulator and LD 14 is disposed on the electrode 21. A surface electrode 8 of the modulator is connected to the feeding strip line 18 and to the resistor 19 with Au wires 22. A surface electrode 9 of the LD is connected to the feeding strip line 17 with an Au wire 22. A common grounding electrode 11 of the integrated modulator and LD 14 contacts the mounting electrode 21, whereby it is grounded via the grounding strip line 20 and the through-hole 15.

FIG. 9 is an equivalent circuit diagram of the optical semiconductor device shown in FIG. 8. In FIG. 9, the same reference numerals as those shown in FIG. 8 designate the same or corresponding parts. Reference character $I_0$ denotes a DC current source, and reference character V denotes a modulation signal applied to the modulator. Further, reference character $R_3$ denotes a resistance of the resistor 19. The resistor 19 is a terminal resistor of a supply source of the modulation signal V.

A description is given of the operation of the optical semiconductor device. When a forward current flows from the DC current source $I_0$ toward the LD surface electrode 9, laser light is produced in the active layer 3 of the LD 200. When a modulation signal V that reversely biases the pn junction within the modulator 100 (V<0) is applied to the modulator surface electrode 8, the active layer 3 in the modulator 100 absorbs the laser light produced in the active layer 3 in the LD 200. The state in which the modulator 100 absorbs the laser light is hereinafter called a "0" pattern. On the other hand, when the modulation signal V is 0 V, the laser light emitted from the LD 200 is not absorbed in but travels through the modulator 100, and this state is hereinafter called a state where the optical semiconductor device 303 is in a "1" pattern.

In the conventional optical semiconductor device including the integrated modulator and LD 14, although the modulator 100 and the LD 200 are separated from each other by the separation groove 41 reaching the second p type InP cladding layer 6, since the modulator 100 and the LD 200 are connected by the cladding layer 6 and the semiconductor layers under the cladding layer 6, the insulation resistance r between the modulator 100 and the LD 200 is not sufficient. Therefore, when a modulation signal having a voltage V<0 is applied to the modulator 100 to operate the optical semiconductor device in the "0" pattern, the current flowing in the LD 200 is reduced from $I_0$ to $I_0+V/r$ (V<0). When the LD driving current is reduced, the carrier concentration in the active layer 3 is reduced, whereby the refractive index of the active layer 3 is increased. As a result, the oscillating wavelength shifts toward the longer wavelength. Therefore, when the light intensity is changed between "1" and "0" by changing the modulation signal V, the wavelength of light emitted from the LD 200 through the modulator 100 is changed.

Generally, the velocity of light traveling through an optical fiber depends on the wavelength of the light. When a 1.3 µm zero dispersion optical fiber is used in a wavelength band of 1.55 µm, the velocity of light traveling through the fiber decreases with an increase in the wavelength of the light. So, the longer the wavelength of the light traveling through the fiber is, the wider the width of the optical pulse becomes as it travels a long distance, whereby the waveform is unfavorably distorted, resulting in a degradation of the transmission performance. Therefore, in optical fiber communication using the conventional optical semiconductor device 303 as a light source, when a modulation signal having a voltage V<0 is applied to the modulator 100 to operate the optical semiconductor device in the "0" pattern, the oscillating wavelength unfavorably shifts toward a longer wavelength, the width of the optical pulse increases, and the waveform is distorted, resulting in a degradation of the optical pulse transmission performance.

In order to solve the problems mentioned above, the injection current to the LD 200 is increased when a modulation signal is applied to make the modulator 100 absorb the laser light, and the injection current is decreased when a modulation signal is applied to make the modulator 100 not absorb the laser light. Thereby, the wavelength of the modulated light becomes longer when the optical semiconductor device 303 is operated at the "1" level than when the optical semiconductor device 303 is operated at the "0" level. When light having such a wavelength variation is transmitted through the optical fiber mentioned above, the width of the optical pulse is reduced, so that the waveform is hardly distorted.

In order to realize the operation mentioned above, conventionally, the power supply for driving the LD 200 is provided with a special circuit for changing the LD driving current synchronously with the circuit outputting the modulation signal that drives the modulator 100.

Although the circuit for changing the LD driving current can prevent degradation of transmission performance, the circuit is very expensive because it includes complicated electronic circuits, such as a synchronizing circuit and a current modulating circuit. As a result, the device cost is significantly increased.

SUMMARY OF THE INVENTION

It is an object of the present invention to provide an optical semiconductor device that hardly degrades optical pulse transmission performance, at a low cost.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, an optical semiconductor device comprises a semiconductor laser diode having a first electrode receiving a current for driving the laser diode, and a grounding electrode; a modulator for modulating light emitted from the semiconductor laser diode, the modulator having a second electrode receiving a current for driving the modulator, and a grounding electrode connected to the grounding electrode of the semiconductor laser diode; a first resistor having a terminal connected to the first electrode of the laser diode; a second resistor connected between the second electrode of the modulator and the grounding electrode of the modulator; and a third resistor having a first terminal connected to the grounding electrode of the modulator and a grounded second terminal. Therefore, the laser diode driving current can be made larger when the modulator absorbs the laser light than when the modulator does not absorb the laser light, whereby the oscillating wavelength is shortened, resulting in an inexpensive optical semiconductor device that hardly degrades the optical pulse transmission performance.

According to a second aspect of the present invention, the above-mentioned optical semiconductor device further includes an inductor connected, in series, between the first electrode of the laser diode and the first resistor. Therefore, the phase of the current flowing through the laser diode can be delayed from the phase of the modulation signal that drives the modulator.

According to a third aspect of the present invention, the above-mentioned optical semiconductor device further includes an inductor connected between the grounding electrode of the modulator and a node of the second resistor and the third resistor. Therefore, the phase of the current flowing through the laser diode can be delayed from the phase of the modulation signal that drives the modulator.

DETAILED DESCRIPTION OF THE PREFERRED EMBODIMENTS

Figure 1:
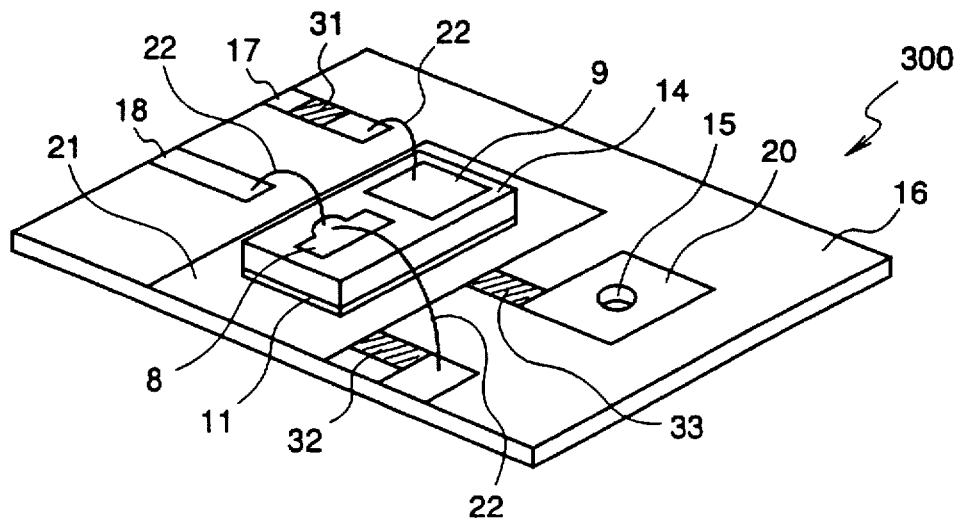
FIG. 1 is a perspective view illustrating an optical semiconductor device in accordance with a first embodiment of the present invention.
Figure 3:
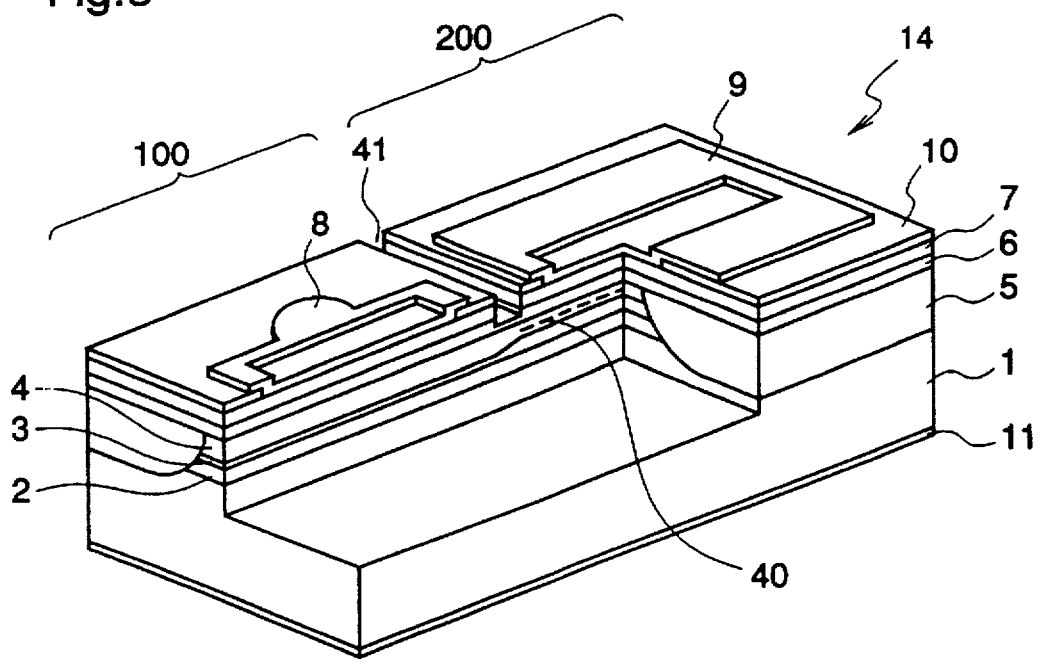
FIG. 3 is a perspective view illustrating an integrated modulator and LD included in the optical semiconductor device shown in FIG. 1.
Figure 10:
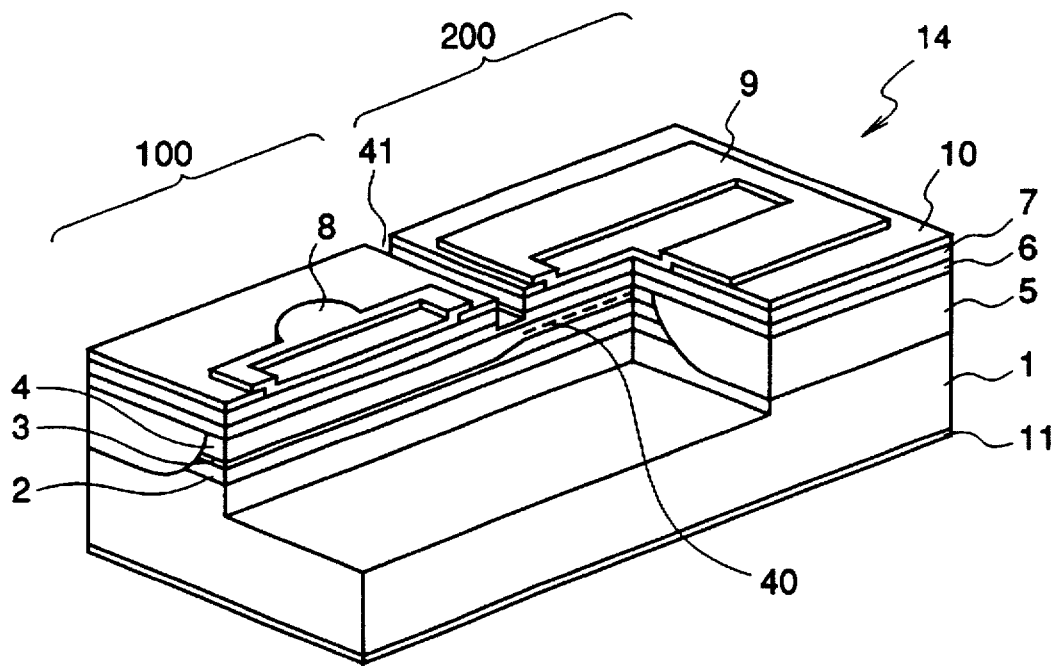
FIG. 10 is a perspective view illustrating an integrated modulator and LD according to the prior art.

FIG. 1 is a perspective view illustrating an optical semiconductor device according to a first embodiment of the present invention. In FIG. 1, an optical semiconductor device 300 includes a dielectric substrate 16, such as $Al_2O_3$, having opposed front and rear surfaces. The rear surface of the substrate 16 is metallized for grounding. An integrated modulator and LD 14 is disposed on the front surface of the dielectric substrate 16 via a mounting electrode 21. The structure of the integrated modulator and LD 14 is shown in FIG. 3. The integrated modulator and LD 14 according to the first embodiment of the invention is identical to the conventional one already described with respect to FIG. 10 and, therefore, does not require repeated description. A grounding strip line 20 comprising Au or the like is connected to the metallized rear surface of the substrate 16 via a through-hole 15. An LD feeding strip line 17 and a modulator feeding strip line 18 are disposed on the front surface of the substrate 16 and connected to the LD surface electrode 9 and the modulator surface electrode 8, respectively, with wires 22 comprising Au or the like. Reference numerals 31, 32, and 33 designate first, second, and third resistors comprising a material having a resistance sufficiently higher than the resistance of the material of the strip lines, for example, tantalum nitride ($Ta_2N$).

Figure 2:
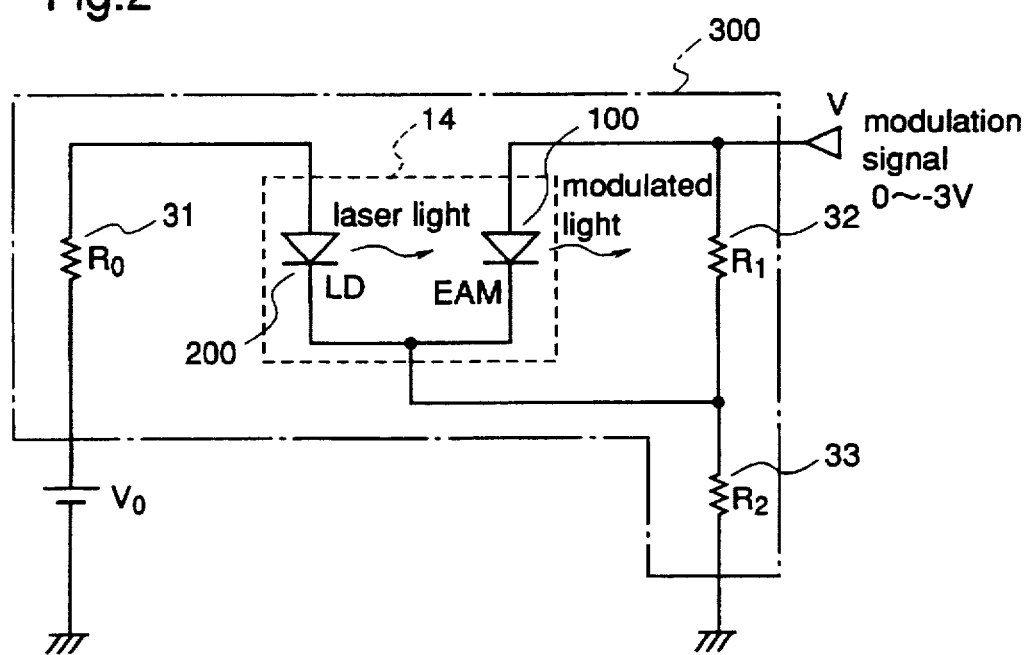
FIG. 2 is an equivalent circuit diagram illustrating the optical semiconductor device shown in FIG. 1.

FIG. 2 is an equivalent circuit diagram illustrating the optical semiconductor device shown in FIG. 1. In FIG. 2, the same reference numerals as those shown in FIG. 1 designate the same or corresponding parts. Reference character $V_O$ denotes a DC voltage source, and character V denotes a modulation signal applied to the modulator 100. Further, reference characters $R_O$, $R_1$, and $R_2$ denote resistances of the first, second, and third resistors 31, 32, and 33, respectively.

In the optical semiconductor device 300 according to the first embodiment of the invention, the integrated modulator and LD 14 is mounted on the dielectric substrate 16 comprising $Al_2O_3$ or the like. The grounding rear electrode 11 is common to the modulator 100 and the LD 200. Further, the LD surface electrode 9 is connected to the first resistor 31 with the wire 22, and the first resistor 31 is connected through the LD feeding strip line 17 to the DC voltage source $V_O$. The modulator surface electrode 8 is connected to the modulator feeding strip line 18 to which the modulation signal V is applied and, further, it is connected through the second resistor 32 and the mounting electrode 21 to the common grounding electrode 11 of the integrated modulator and LD 14. Furthermore, the common grounding electrode 11 is grounded through the mounting electrode 21, the third resistor 33, the grounding strip line 20, and the through-hole 15.

A description is given of the operation of the optical semiconductor device 300. When a forward current flows from the DC source $V_0$ through the first resistor 31 toward the LD surface electrode 9, laser light is produced in the active layer 3 of the LD 200. This laser light travels through the active layer 3 of the modulator 100 and is emitted from a facet of the integrated modulator and LD 14. When a modulation signal V that reversely biases the pn junction within the modulator 100 (V<0) is applied through the modulator feeding strip line 18 to the modulator surface electrode 8, the active layer 3 of the modulator 100 absorbs the laser light produced in the active layer 3 of the LD 200. When the laser light is absorbed in the modulator 100, the optical semiconductor device 300 is in the "0" pattern, as described for the conventional device. When the modulation signal V is 0 V, laser light produced in the LD 200 is not absorbed in but travels through the modulator 100. In this state, the optical semiconductor device 300 is in the "1" pattern.

Although there is an insulation resistance r between the modulator surface electrode 8 and the LD surface electrode 9 in the optical semiconductor device 300 as described for the conventional device, this insulation resistance r can be ignored because $R_1 \ll r$. So, a current I flowing in the LD 200 is given by $$I = \frac{(R_1 + R_2)V_0 - R_2V}{R_0(R_1 + R_2) + R_1R_2} \quad (1)$$

Since $R_1 + R_2$ becomes a terminal resistor for a modulator power supply (not shown) that outputs the modulation signal V, when an internal impedance of the modulator power supply is given by Z, $R_1 + R_2$ is equal to Z. Further, since $R_0$, $R_1$, $R_2 > 0$, $V_0 > 0$, and $V \leq 0$, the current flowing through the LD 200 when the integrated modulator and LD 14 is at the "0" level, i.e., when the voltage V applied to the modulator surface electrode 8 is smaller than 0 and the modulator 100 absorbs laser light, is larger than the current flowing through the LD 200 when the integrated modulator and LD 14 is at the "1" level, i.e., when the voltage V is equal to 0 and the modulator 100 does not absorb laser light. This difference in the current values is given by $$|\Delta I| = \frac{R_2|V|}{R_0Z + R_1R_2} \quad (2)$$

Therefore, the current flowing through the LD surface electrode 9 when the integrated modulator and LD 14 is operated at the "0" level can be always larger than the current flowing through the electrode 9 when the integrated modulator and LD 14 is operated at the "1" level.

For example, when $Z=50\Omega$, $V=-1V$, $R_0=45\Omega$, $R_1=20\Omega$, and $R_2=30\Omega$ in formula (2), $\Delta I=10$mA is attained as a change of the current I. Usually, the rate of change in the LD oscillating wavelength to the injected current is about $-0.1$ Å/mA, so that a wavelength change of about $-1$ Å is realized when $|\Delta I|=10$ mA. That is, when the integrated modulator and LD 14 is operated at the "0" level, the oscillating wavelength is shortened by about 1 Å as compared to the case where it is operated at the "1" level.

As described above, according to the first embodiment of the invention, the optical semiconductor device 300 includes the first resistor 31 connected to the LD surface electrode 9 of the integrated modulator and LD 14, the second resistor 32 connected between the modulator surface electrode 8 and the common grounding electrode 11, and the third resistor 33 connected between the common grounding electrode 11 and the ground. Therefore, the current flowing through the LD surface electrode 9 is larger when the integrated modulator and LD 14 is operated at the "0" level than when the integrated modulator and LD 14 is operated at the "1" level, whereby the wavelength is shortened. In this case, unwanted reduction in the LD driving current when the integrated modulator and LD 14 is at the "0" level is avoided without using a special circuit for changing the current in response to the modulation signal, resulting in an inexpensive optical semiconductor device that hardly degrades the optical pulse transmission performance.

[Embodiment 2]

Figure 4:
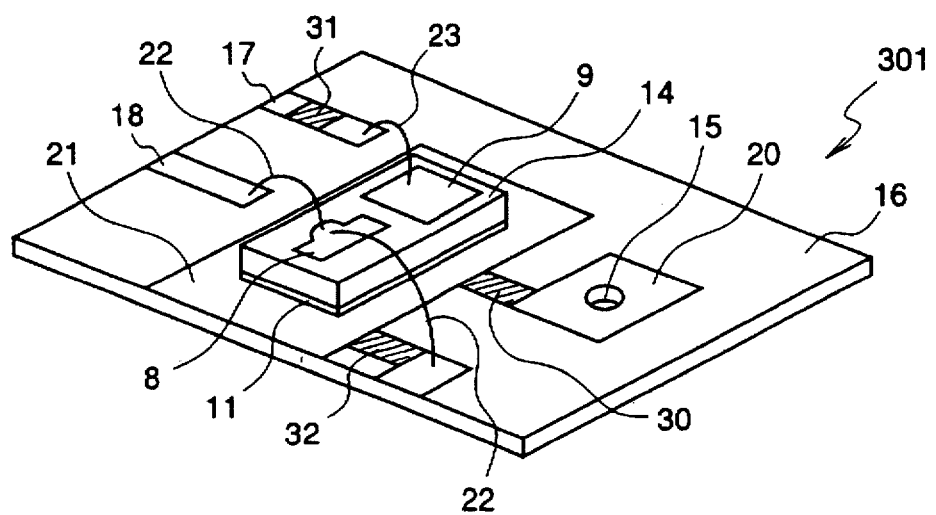
FIG. 4 is a perspective view illustrating an optical semiconductor device in accordance with a second embodiment of the present invention.

FIG. 4 is a perspective view illustrating an optical semiconductor device in accordance with a second embodiment of the present invention. In FIG. 4, the same reference numerals as those shown in FIG. 1 designate the same or corresponding parts. Reference numeral 23 designates an inductor, for example, a wire inductor comprising Au and having a diameter of 25 μm.

Figure 5:
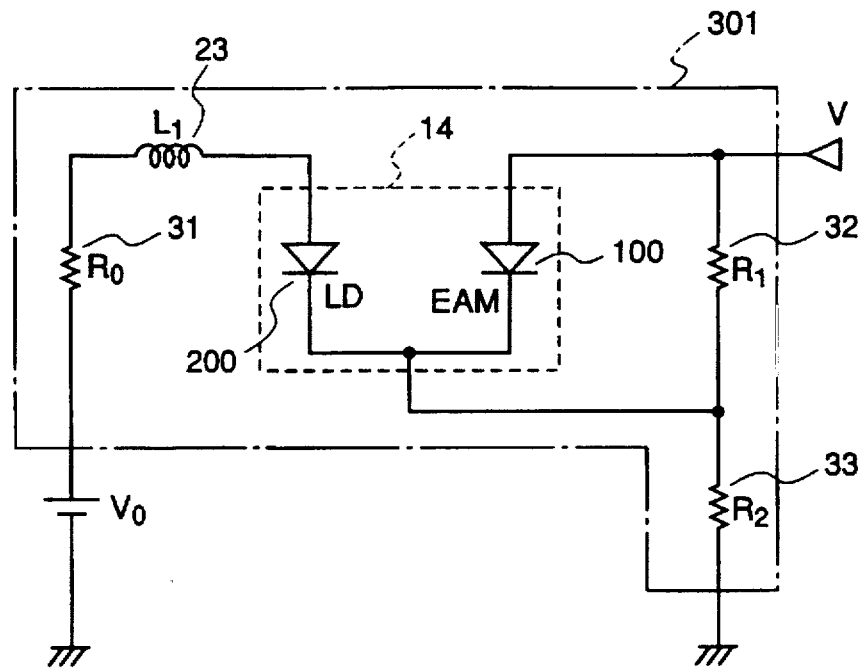
FIG. 5 is an equivalent circuit diagram illustrating the optical semiconductor device shown in FIG. 4.

FIG. 5 is an equivalent circuit diagram of the optical semiconductor device shown in FIG. 4. In the figure, the same reference numerals and characters as those shown in FIG. 2 designate the same or corresponding parts. Reference character $L_1$ denotes an inductance of the inductor 23.

The optical semiconductor device according to this second embodiment is identical to the optical semiconductor device according to the first embodiment except that the inductor 23 is connected in series between the first resistor 31 and the LD surface electrode 9.

A description is given of the operation of the optical semiconductor device. When the frequency of the modulation signal V driving the modulator 100 is denoted by f, the driving current I(f) for the LD 200, which changes with a change of the modulation signal V, is given by $$I(f) = \frac{R_0Z + R_1R_2 - j \cdot 2\pi fL_1Z}{(R_0Z + R_1R_2)^2 + (2\pi fL_1Z)^2} \{(R_1 + R_2)V_0 - R_2V\} \quad (3)$$

wherein j is the imaginary unit. At this time, the phase delay of the driving current I(f) from the phase of the modulation voltage V is given by $$\theta = \tan^{-1}\frac{2\pi fL_1Z}{R_0Z + R_1R_2} \quad (4)$$

Therefore, although the difference in phases between the modulation signal V and the LD driving current that changes in response to the modulation signal V is zero in the first embodiment of the invention, since the inductor 23 having an inductance $L_1$ is included in the optical semiconductor device according to this first embodiment, the phase of the LD driving current can be delayed from the phase of the modulation signal V.

For example, when a wire inductor comprising Au and having a diameter of 25 μm and a length of 1 mm is employed as the inductor 23, the inductance $L_1$ of the wire inductor 23 is 0.87 nH. In this case, when $R_0=45\Omega$, $V=-1$ V, $Z=50\Omega$, $R_1=20\Omega$, $R_2=30\Omega$, and f=2.5 GHz in formula (4), $\theta=13.5°$ stands. Further, from formula (2), the absolute value of the difference in current values flowing through the LD 200 between when the integrated modulator and LD 14 is at the "1" level and when it is at the "0" level, i.e., |ΔI|, is 10 mA.

As described above, according to the second embodiment of the invention, since the optical semiconductor device includes the inductor 23 between the LD surface electrode 9 and the first resistor 31, the phase of the LD driving current can be delayed from the phase of the modulation signal V.

[Embodiment 3]

Figure 6:
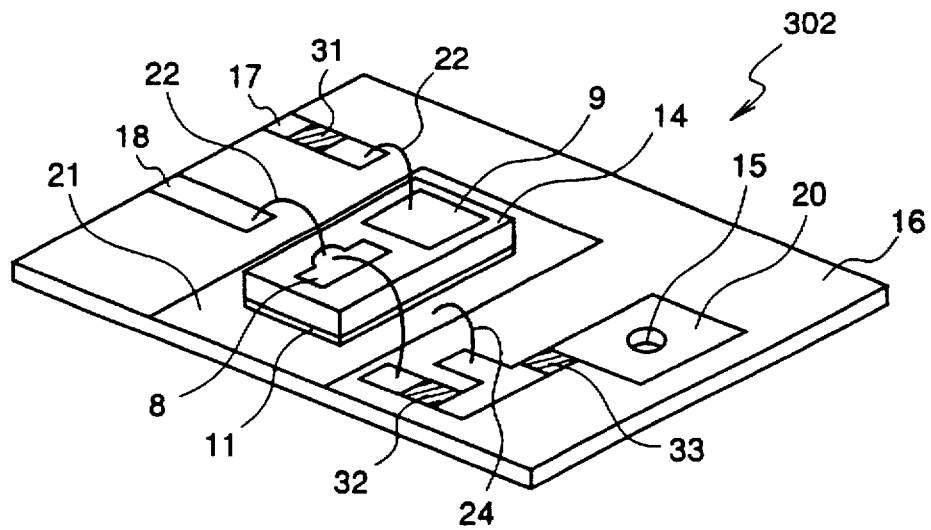
FIG. 6 is a perspective view illustrating an optical semiconductor device in accordance with a third embodiment of the present invention.

FIG. 6 is a perspective view illustrating an optical semiconductor device in accordance with a third embodiment of the present invention. In FIG. 6, the same reference numerals as those shown in FIG. 4 designate the same or corresponding parts. Reference numeral 24 designates an inductor, for example, a wire inductor comprising Au and having a diameter of 25 μm.

Figure 7:
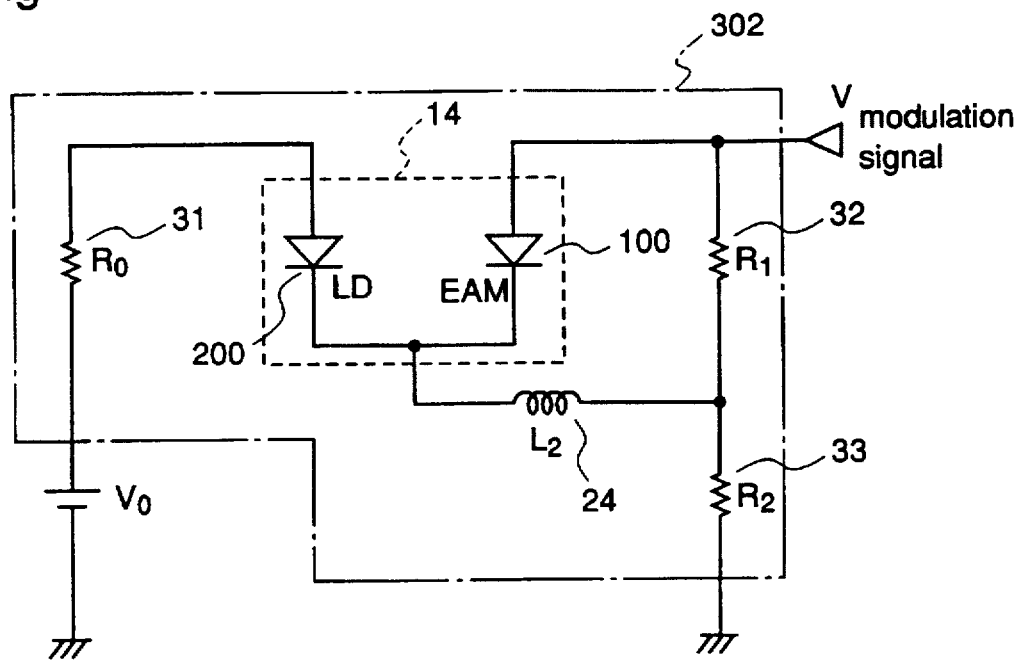
FIG. 7 is an equivalent circuit diagram illustrating the optical semiconductor device shown in FIG. 6.
Figure 8:
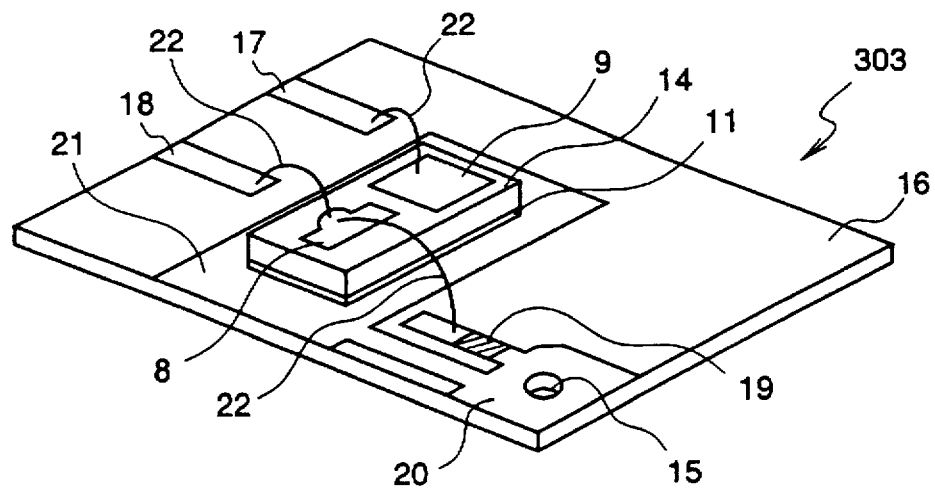
FIG. 8 is a perspective view illustrating an optical semiconductor device according to the prior art.
Figure 9:
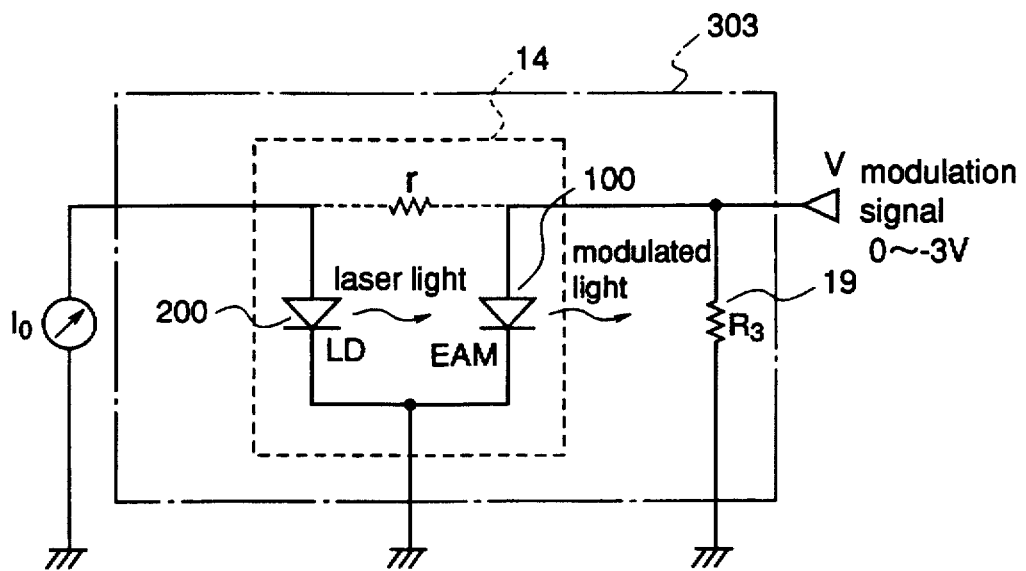
FIG. 9 is an equivalent circuit diagram illustrating the optical semiconductor device shown in FIG. 8.

FIG. 7 is an equivalent circuit diagram of the optical semiconductor device shown in FIG. 6. In the figure, the same reference numerals and characters as those shown in FIG. 5 designate the same or corresponding parts. Reference character $L_2$ denotes an inductance of the inductor 24.

The optical semiconductor device according to this third embodiment is identical to the optical semiconductor device according to the second embodiment except that the common grounding electrode 11 is connected through the inductor 24 to the resistor 32 and the resistor 33 whereas the inductor 23 is connected between the LD surface electrode 9 and the first resistor 31.

Also in this optical semiconductor device, the driving current I(f) for the LD 200 is given by $$I(f) = \frac{R_0Z + R_1R_2 - j \cdot 2\pi f L_1 Z}{(R_0Z + R_1R_2)^2 + (2\pi f L_1 Z)^2} \{(R_1 + R_2)V_0 - R_2V\}$$

and the delay of the phase of the driving current I(f) from the phase of the modulation voltage V is given by $$\theta = \tan^{-1} \frac{2\pi f L_1 Z}{R_0Z + R_1R_2}$$

Therefore, as in the second embodiment of the invention, the phase of the change of the LD driving current can be delayed from the phase of the modulation signal V.

In the foregoing description, emphasis has been placed upon an optical semiconductor device including a DFB-LD and a modulator integrated on a semiconductor substrate. However, the present invention may be applied to any optical semiconductor device as long as it includes an LD and a modulator for modulating light output from the LD, with the same effects as described for the first to third embodiments.

What is claimed is:

1. An optical semiconductor device comprising:

a semiconductor laser diode having a first electrode for receiving a current for driving the laser diode and a second electrode;

a modulator for modulating light emitted from the semiconductor laser diode, the modulator having a third electrode for receiving a current for driving the modulator, and a fourth electrode connected to and common with the second electrode of the semiconductor laser diode;

a first resistor having a terminal connected to the first electrode;

a second resistor connected to the third electrode and directly to the fourth electrode; and a third resistor having a first terminal connected to the fourth electrode and a second terminal connected to ground.

2. The device of claim 1 including an inductor connected, in series, between the first electrode and the first resistor.

3. An optical semiconductor device comprising:

a semiconductor laser diode having a first electrode for receiving a current for driving the laser diode and a second electrode;

a modulator for modulating light emitted from the semiconductor laser diode, the modulator having a third electrode for receiving a current for driving the modulator, and a fourth electrode connected to and common with the second electrode of the semiconductor laser diode;

a first resistor having a terminal connected to the first electrode;

a second resistor connected to the third electrode and to the fourth electrode; and a third resistor having a first terminal connected to the fourth electrode and a second terminal connected to ground including an inductor connected between the fourth electrode of the modulator and a node of the second resistor and the third resistor.

4. The device of claim 1 wherein the semiconductor laser diode is a distributed feedback laser diode;

the laser diode and the modulator are integrated on a semiconductor substrate and adjacent to each other; and the first electrode and the third electrode are electrically separated from each other by a groove.

* * * * *